(12) United States Patent
Yoshida (10) Patent No.: US 6,870,369 B2
(45) Date of Patent: Mar. 22, 2005

(54) RF COIL APPARATUS AND MAGNETIC RESONANCE IMAGING APPARATUS

(75) Inventor: Masaru Yoshida, Tokyo (JP)

(73) Assignee: GE Medical Systems Global Technology Company, LLC, Waukesha, WI (US)

(*) Notice: Subject to any disclaimer, the term of this patent is extended or adjusted under 35 U.S.C. 154(b) by 0 days.

(21) Appl. No.: 10/806,891

(22) Filed: Mar. 23, 2004

(65) Prior Publication Data

US 2004/0189302 A1 Sep. 30, 2004

(30) Foreign Application Priority Data

Mar. 24, 2003 (JP) .................................. 2003-080443

(51) Int. Cl.⁷ ................................................ G01V 3/00
(52) U.S. Cl. ........................................ 324/318; 600/421
(58) Field of Search ............................... 324/318, 322, 324/300, 307, 309; 600/421, 422

(56) References Cited

U.S. PATENT DOCUMENTS

| | | | |
|---|---|---|---|
| 4,881,034 A | * 11/1989 | Kaufman et al. | 324/318 |
| 4,952,879 A | * 8/1990 | Van Vaals et al. | 324/322 |
| 6,249,121 B1 | * 6/2001 | Boskamp et al. | 324/318 |
| 6,479,999 B1 | 11/2002 | DeMeester et al. | |
| 6,487,436 B1 | 11/2002 | Boskamp et al. | |
| 6,538,443 B2 | 3/2003 | Morich et al. | |
| 6,630,829 B1 | 10/2003 | Liu | |

* cited by examiner

*Primary Examiner*—Louis Arana
(74) *Attorney, Agent, or Firm*—Carl B. Horton, Esq.; Armstrong Teasdale LLP (57) ABSTRACT

A magnetic resonance imaging apparatus is provided for collecting magnetic resonance signals while applying a static magnetic field, a gradient magnetic field and an RF magnetic field to a subject to be imaged, and producing an image based on the magnetic resonance signals, the apparatus comprising: an RF coil for conducting at least one of the application of the RF magnetic field and reception of the magnetic resonance signals, in which RF coil, ratios of the electric currents flowing through a plurality of coil elements connected in parallel are adjusted by adjusting device.

16 Claims, 6 Drawing Sheets

RF COIL APPARATUS AND MAGNETIC RESONANCE IMAGING APPARATUS

CROSS REFERENCE TO RELATED APPLICATIONS

This application claims the benefit of Japanese Application No. 2003-080443 filed Mar. 24, 2003.

BACKGROUND OF THE INVENTION

The present invention relates to an RF (radio frequency) coil apparatus and a magnetic resonance imaging apparatus, and more particularly to an RF coil apparatus that provides a variable FOV (field of view), and a magnetic resonance imaging apparatus comprising such an RF coil apparatus.

Magnetic resonance imaging apparatuses include one that controls an RF coil to modify an FOV. Such a magnetic resonance imaging apparatus has a bird-cage main coil combined on its ends with a pair of sub-coils, which are turned on/off to switch the FOV between a small one and a large one. (For example, see Non-patent Document 1.).

Non-patent Document 1

Boskamp, "Fast Drop Off Cylindrical RF Transmit Coils", *ISRM* 2002, Book of Abstracts, 874 (U.S.), 2002.

Such an RF coil can merely switch the FOV between the two and cannot form an arbitrary FOV.

SUMMARY OF THE INVENTION

It is therefore an object of the present invention to provide an RF coil apparatus capable of forming an arbitrary FOV, and a magnetic resonance imaging apparatus comprising such an RF coil apparatus.

(1) The present invention, in one aspect for solving the aforementioned problem, is an RF coil apparatus characterized in comprising: a plurality of coil elements connected in parallel; and adjusting means for adjusting electric current ratios among said plurality of coil elements.

(2) The present invention, in another aspect for solving the aforementioned problem, is a magnetic resonance imaging apparatus for collecting magnetic resonance signals while applying a static magnetic field, a gradient magnetic field and an RF magnetic field to a subject to be imaged, and producing an image based on the magnetic resonance signals, said apparatus characterized in comprising: an RF coil apparatus for conducting at least one of the application of said RF magnetic field and reception of said magnetic resonance signals, said RF coil apparatus comprising: a plurality of coil elements connected in parallel; and adjusting means for adjusting electric current ratios among said plurality of coil elements.

In the invention of these aspects, since the adjusting means adjusts the electric current ratios among a plurality of coil elements, an FOV is defined according to the electric current ratios, and an arbitrary FOV can thus be formed.

Preferably, said adjusting means adjusts the electric current ratios by adjusting the admittances of said plurality of coil elements so that the electric current ratios can be easily adjusted.

Preferably, said adjusting means adjusts the admittances by adjusting the electrostatic capacitances of said plurality of coil elements so that the admittances can be easily adjusted.

Preferably, said adjusting means adjusts the electric current ratios among said plurality of coil elements while keeping the overall electrostatic capacitance of the parallel circuit of said plurality of coil elements at a constant level so that the resonance frequency can be kept unchanged.

Preferably, said adjusting means stores the electric current ratios among said plurality of coil elements corresponding to an FOV so that the electric current ratios can be easily calculated.

Preferably, said adjusting means also adjusts the overall electrostatic capacitance of the parallel circuit of said plurality of coil elements so that the resonance frequency can be changed.

Preferably, said adjusting means stores the electric current ratios and circuit constants of said plurality of coil elements corresponding to an FOV so that the electric current ratios can be easily calculated.

Preferably, said plurality of coil elements have a common coil axis, and are arranged at intervals on said coil axis so that the FOV can be adjusted along an axis.

According to the present invention, an RF coil apparatus capable of forming an arbitrary FOV, and a magnetic resonance imaging apparatus comprising such an RF coil apparatus are provided.

Further objects and advantages of the present invention will be apparent from the following description of the preferred embodiments of the invention as illustrated in the accompanying drawings.

DETAILED DESCRIPTION OF THE INVENTION

Figure 1:
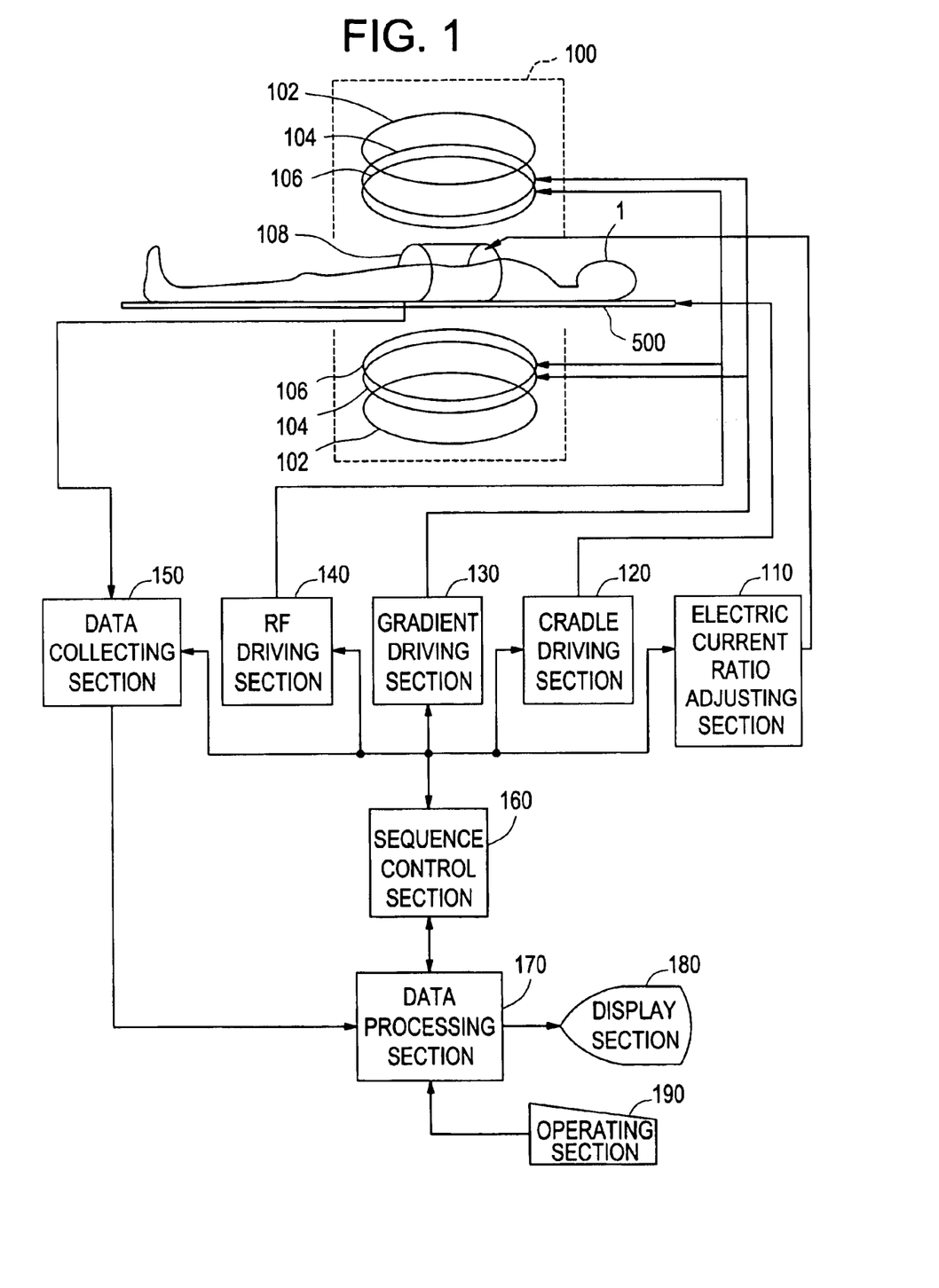
FIG. 1 is a block diagram of an apparatus in accordance with an embodiment of the present invention.

Embodiments of the present invention will now be described in detail with reference to the accompanying drawings. FIG. 1 shows a block diagram of a magnetic resonance imaging apparatus. The configuration of the apparatus represents an embodiment of the magnetic resonance imaging apparatus in accordance with the present invention.

As shown in FIG. 1, the present apparatus has a magnet system 100. The magnet system 100 has a main magnetic field magnet section 102, a gradient coil section 104, and an RF coil section 106. The main magnetic field magnet section 102 and the coil sections are each comprised of a pair of members facing each other across a space. These sections have a generally disk-like shape and are disposed to have a common center axis.

A subject 1 is rested on a cradle 500 and carried into and out of an internal space of the magnet system 100. The cradle 500 is driven by a cradle driving section 120.

The region to be imaged in the subject 1 is received within a reception coil section 108. The reception coil section 108 has a generally cylindrical shape. The reception coil section 108 has a plurality of coil elements. The ratios of the electric currents flowing through individual coil elements are adjusted by an electric current ratio adjusting section 110. The reception coil section 108 and electric current ratio adjusting section 110 will be described in detail later.

The main magnetic field magnet section 102 generates a static magnetic field in the internal space of the magnet system 100. The direction of the static magnetic field is generally orthogonal to the direction of the body axis of the subject 1. That is, a magnetic field commonly referred to as a vertical magnetic field is generated.

The main magnetic field magnet section 102 is made using a permanent magnet, for example. By using the permanent magnet, the static magnetic field can be easily generated. However, the main magnetic field magnet section 102 is not limited to a permanent magnet, and may be made using a super or normal conductive electromagnet or the like.

The gradient coil section 104 generates three gradient magnetic fields for imparting gradients to the static magnetic field strength in directions of three mutually perpendicular axes, i.e., a slice axis, a phase axis, and a frequency axis.

Representing mutually perpendicular coordinate axes in the static magnetic field space as x, y, and z, any one of the axes may be the slice axis. In this case, one of the two remaining axes is the phase axis and the other is the frequency axis. Moreover, the slice, phase, and frequency axes can be given arbitrary inclination with respect to the x-, y-, and z-axes while maintaining their mutual perpendicularity. This is sometimes referred to as an oblique technique. In the present apparatus, the direction of the body axis of the subject 1 is defined as the z-axis direction.

The gradient magnetic field in the slice axis direction is sometimes referred to as the slice gradient magnetic field. The gradient magnetic field in the phase axis direction is sometimes referred to as the phase encoding gradient magnetic field. The gradient magnetic field in the frequency axis direction is sometimes referred to as the readout gradient magnetic field. The readout gradient magnetic field is synonymous with the frequency encoding gradient magnetic field. In order to enable generation of such gradient magnetic fields, the gradient coil section 104 has three gradient coils, which are not shown. The gradient magnetic field will be sometimes referred to simply as the gradient hereinbelow.

The transmission coil section 106 generates an RF magnetic field in the static magnetic field space for exciting spins within the subject 1. The generation of the RF magnetic field will be sometimes referred to as transmission of an RF excitation signal hereinbelow. Moreover, the RF excitation signal will be sometimes referred to as the RF pulse. Electromagnetic waves, i.e., magnetic resonance signals, generated by the excited spins are received by the reception coil section 108.

The reception coil section 108 may be used as an RF coil for transmitting an RF pulse, instead of using the transmission coil section 106. It also may be used both in transmission and reception. While the following description will address the reception coil section 108 dedicated for reception, the same applies to that used in transmission or both in transmission and reception.

The magnetic resonance signals are those in a frequency domain, i.e., in a Fourier space. Since the magnetic resonance signals are encoded in two axes by the gradients in the phase- and frequency-axis directions, the magnetic resonance signals are obtained as signals in a two-dimensional Fourier space. The phase encoding gradient and readout gradient are used to determine a position at which a signal is sampled in the two-dimensional Fourier space. The two-dimensional Fourier space will be sometimes referred to as the k-space hereinbelow.

The gradient coil section 104 is connected with a gradient driving section 130. The gradient driving section 130 supplies driving signals to the gradient coil section 104 to generate the gradient magnetic fields. The gradient driving section 130 has three driving circuits, which are not shown, corresponding to the three gradient coils in the gradient coil section 104.

The transmission coil section 106 is connected with an RF driving section 140. The RF driving section 140 supplies driving signals to the RF coil section 108 to transmit an RF pulse, thereby exciting the spins within the subject 1.

The reception coil section 108 is connected with a data collecting section 150. The data collecting section 150 collects signals received by the reception coil section 108 as digital data.

The gradient driving section 130, RF driving section 140 and data collecting section 150 are connected with a sequence control section 160. The sequence control section 160 controls the electric current ratio adjusting section 110, gradient driving section 130, RF driving section 140 and data collecting section 150 to carry out the collection of magnetic resonance signals.

The sequence control section 160 is, for example, constituted using a computer. The sequence control section 160 has a memory, which is not shown. The memory stores programs for the sequence control section 160 and several kinds of data. The function of the sequence control section 160 is implemented by the computer executing a program stored in the memory.

The output of the data collecting section 150 is connected to a data processing section 170. Data collected by the data collecting section 150 are input to the data processing section 170. The data processing section 170 is, for example, constituted using a computer. The data processing section 170 has a memory, which is not shown. The memory stores programs for the data processing section 170 and several kinds of data.

The data processing section 170 is connected to the sequence control section 160. The data processing section 170 is above the sequence control section 160 and controls it. The function of the present apparatus is implemented by the data processing section 170 executing a program stored in the memory.

A portion comprised of the reception coil section 108, electric current ratio adjusting section 110, sequence control section 160 and data processing section 170 is an embodiment of the RF coil apparatus of the present invention. The configuration of the apparatus represents an embodiment of the RF coil apparatus in accordance with the present invention.

The data processing section 170 stores the data collected by the data collecting section 150 into the memory. A data space is established in the memory. The data space corresponds to the k-space. The data processing section 170 performs two-dimensional inverse Fourier transformation on the data in the k-space to reconstruct an image.

The data processing section 170 is connected with a display section 180 and an operating section 190. The display section 180 comprises a graphic display, etc. The operating section 190 comprises a keyboard, etc., provided with a pointing device.

The display section 180 displays the reconstructed image output from the data processing section 170 and several kinds of information. The operating section 190 is operated by a user to input several commands, information and so forth to the data processing section 170. The user interactively operates the present apparatus via the display section 180 and operating section 190.

Figure 2:
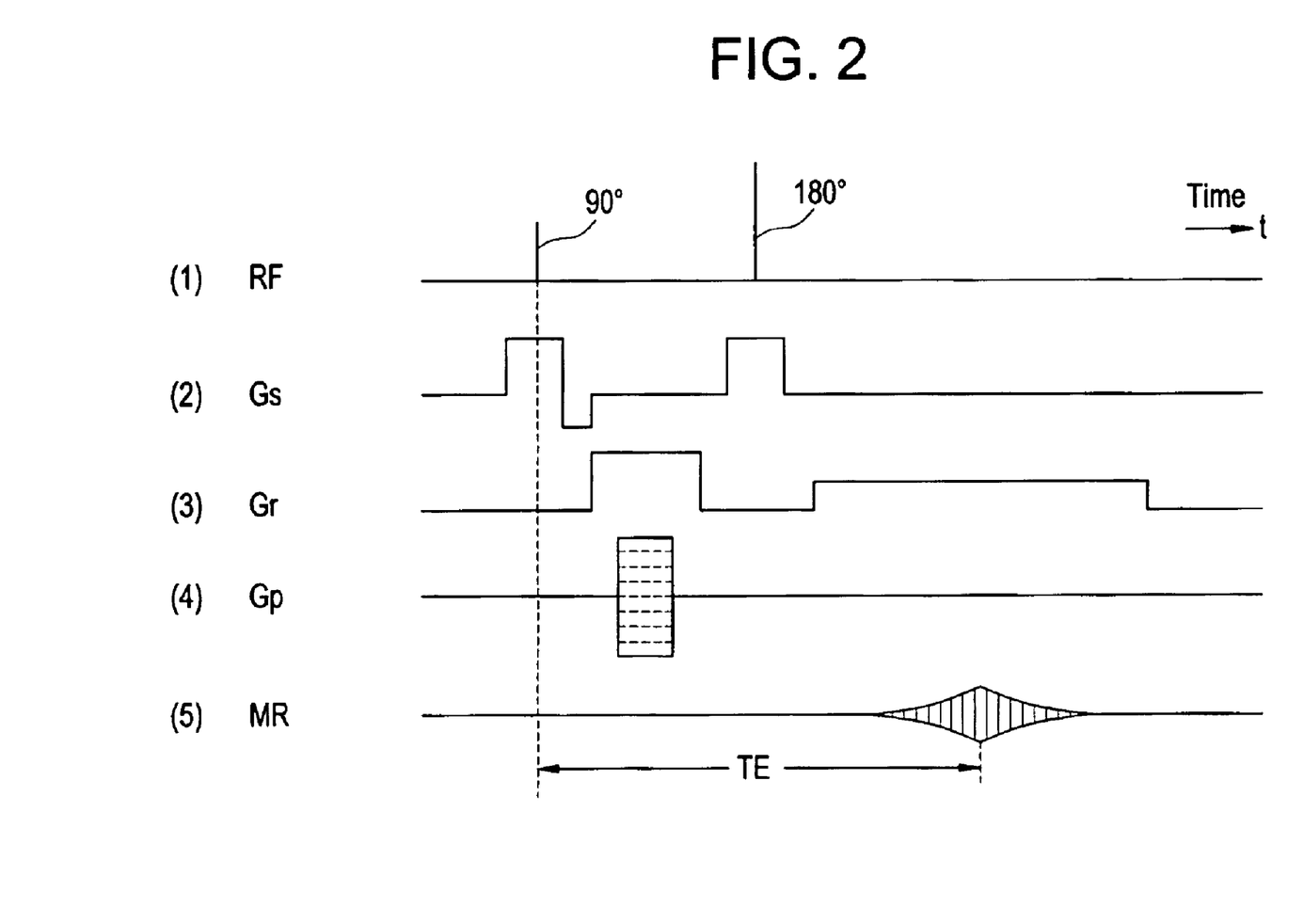
FIG. 2 shows an exemplary pulse sequence for magnetic resonance imaging.

FIG. 2 shows an exemplary pulse sequence for use in magnetic resonance imaging. The pulse sequence is one according to a spin echo (SE) technique.

Specifically, FIG. 2(1) is a sequence of 90° and 180° pulses for RF excitation according to the SE technique, and (2), (3), (4), and (5) are sequences of a slice gradient Gs, readout gradient Gr, phase encoding gradient Gp, and spin echo MR, respectively, according to the SE technique. The 90° and 180° pulses are represented by their respective center signals. The pulse sequence proceeds along a time axis t from the left to the right.

As shown, the 90° pulse achieves 90° excitation of the spins. At that time, a slice gradient Gs is applied to perform selective excitation of a certain slice. After a certain time from the 90° excitation, 180° excitation, i.e., spin inversion, is achieved by the 180° pulse. Again, at that time, a slice gradient Gs is applied to perform selective inversion of the same slice.

In the period between the 90° excitation and spin inversion, a readout gradient Gr and a phase encoding gradient Gp are applied. The readout gradient Gr dephases the spins. The phase encoding gradient Gp phase-encodes the spins.

After the spin inversion, the spins are rephased by a readout gradient Gr to cause a spin echo MR to be generated. The spin echo MR is collected by the data collecting section 150 as view data. Such a pulse sequence is repeated 64–512 times in a cycle TR (repetition time). The phase encoding gradient Gp is changed for each repetition to effect different phase encoding each time. Thus, view data are obtained for 64–512 views.

Figure 3:
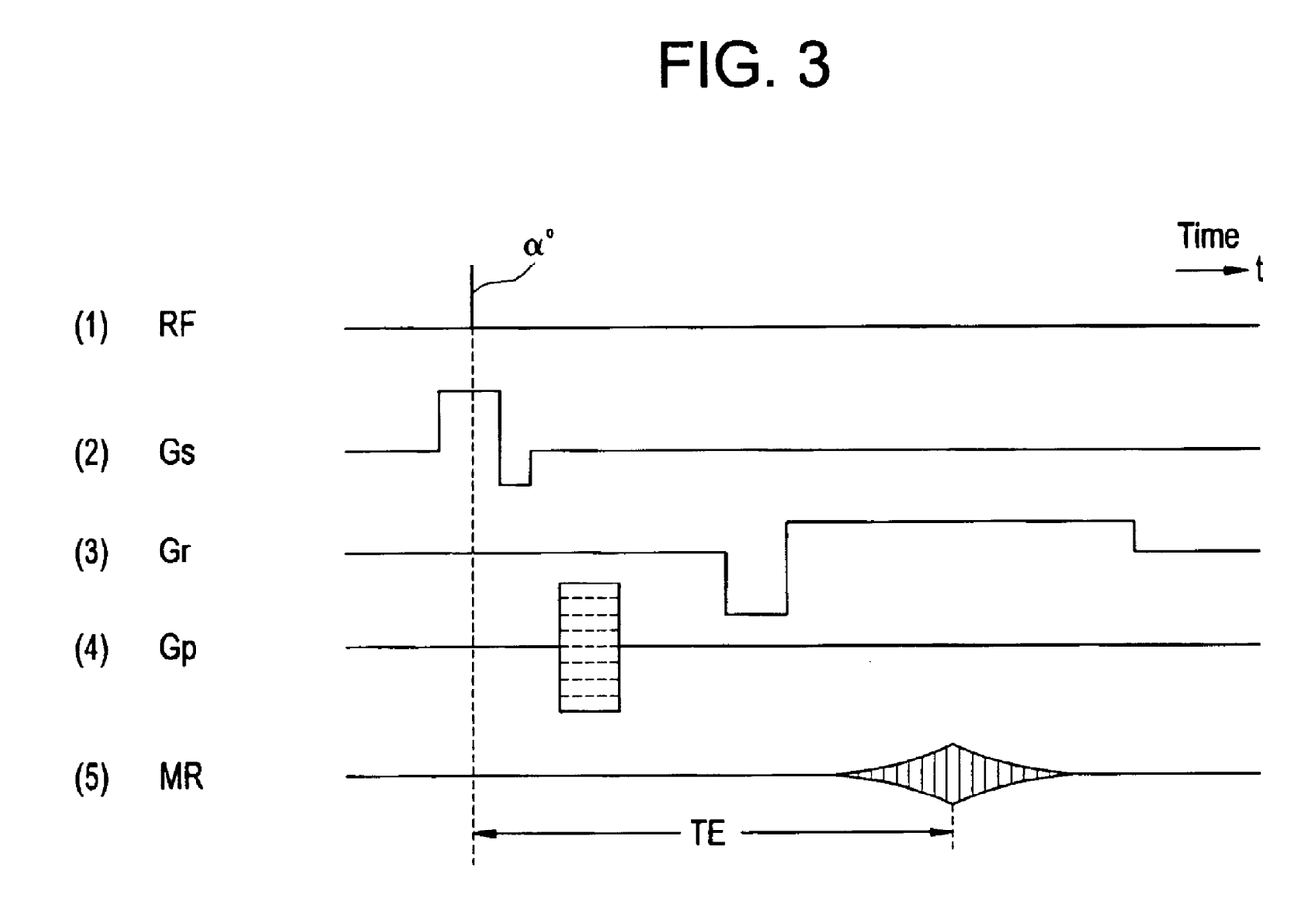
FIG. 3 shows another exemplary pulse sequence for magnetic resonance imaging.

Another example of the pulse sequence for magnetic resonance imaging is shown in FIG. 3. This pulse sequence is one according to a GRE (gradient echo) technique.

Specifically, FIG. 3(1) is a sequence of an α° pulse for RF excitation according to the GRE technique, and (2), (3), (4), and (5) are sequences of a slice gradient Gs, readout gradient Gr, phase encoding gradient Gp, and gradient echo MR, respectively, according to the GRE technique. The α° pulse is represented by its central value. The pulse sequence proceeds along a time axis t from the left to the right.

As shown, the α° pulse achieves α° excitation of the spins. α is 90 or less. At that time, a slice gradient Gs is applied to perform selective excitation of a certain slice.

After the α° excitation, a phase encoding gradient Gp phase-encodes the spins. Next, the spins are first dephased and subsequently rephased by a readout gradient Gr to cause a gradient echo MR to be generated. The gradient echo MR is collected by the data collecting section 150 as view data. Such a pulse sequence is repeated 64–512 times in a cycle TR. The phase encoding gradient Gp is changed for each repetition to effect different phase encoding each time. Thus, view data are obtained for 64–512 views.

The view data acquired by the pulse sequence shown in FIG. 2 or 3 are collected in the memory in the data processing section 170. The pulse sequence is not limited to one according to the SE or GRE technique, and it will be easily recognized that a pulse sequence according to any other appropriate technique such as a fast spin echo (FSE) technique or echo planar imaging (EPI) may be employed. The data processing section 170 reconstructs an image based on the view data collected in the memory.

Figure 4:
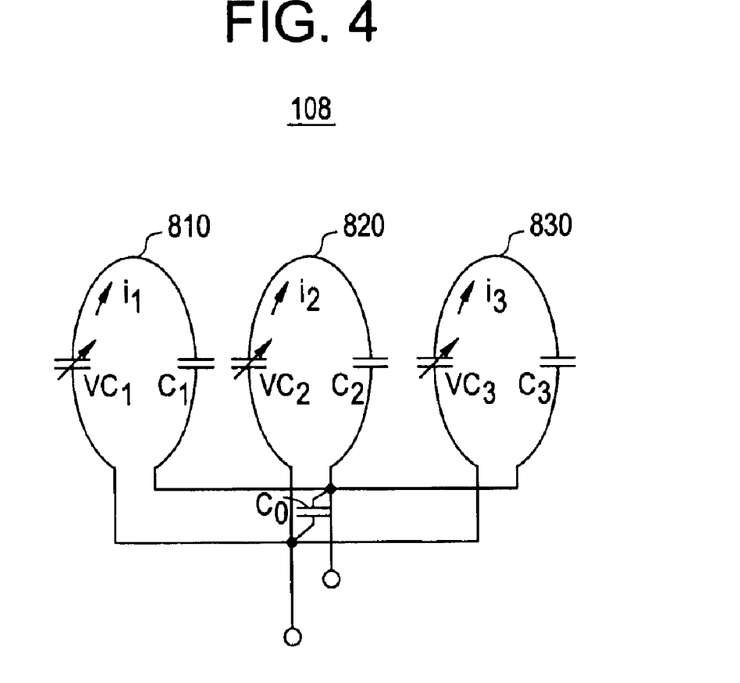
FIG. 4 shows an electrical configuration of a reception coil section.

FIG. 4 shows an exemplary electrical configuration of the reception coil section 108. As shown, the reception coil section 108 has three coil elements 810, 820 and 830 connected in parallel. The coil elements 810, 820 and 830 correspond to an embodiment of the coil elements of the present invention. The number of the coil elements is not limited to three but may be any appropriate number. Although the following description will be made on a case in which the number of the coil elements is three, the same applies to a case of any other plural number of coil elements.

Each of the coil elements 810 (i=1–3) is a loop of a conductor in which a capacitor Ci and a variable capacitor VCi are connected in series. The coil elements 810–830 are arranged at predetermined intervals, for example, at regular intervals, along a center axis, or coil axis, of the reception coil section 108. The coil elements 810–830 are connected with a capacitor C0 in parallel, whose ends are signal terminals. The received signals are taken out from these signal terminals. If the reception coil section 108 is used in transmission or both in transmission and reception, the signal terminals serve as transmission signal supply terminals.

Figure 5:
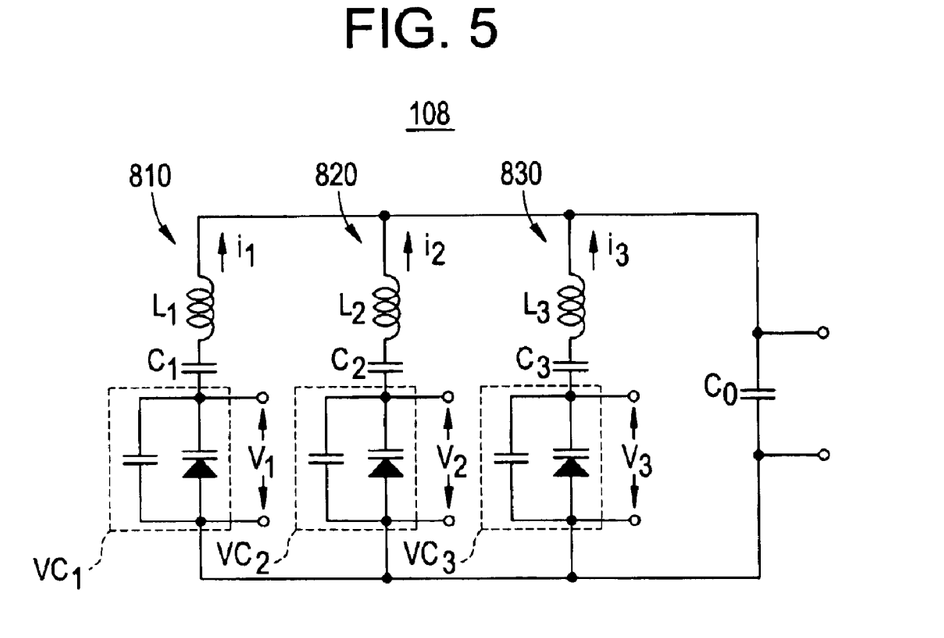
FIG. 5 shows a circuit of the reception coil section.

FIG. 5 shows an exemplary electrical circuit of the reception coil section 108. As shown, each coil element 8i0 is represented by a series circuit of an inductor Li, a capacitor Ci and a variable capacitor VCi. The variable capacitor VCi is comprised of a parallel circuit of a variable-capacity diode and a fixed-capacity capacitor. A voltage vi is supplied across the parallel circuit, which voltage is for adjusting the electrostatic capacitance of the variable capacitor VCi. The voltage vi is supplied by the electric current ratio adjusting section 110.

Figure 6:
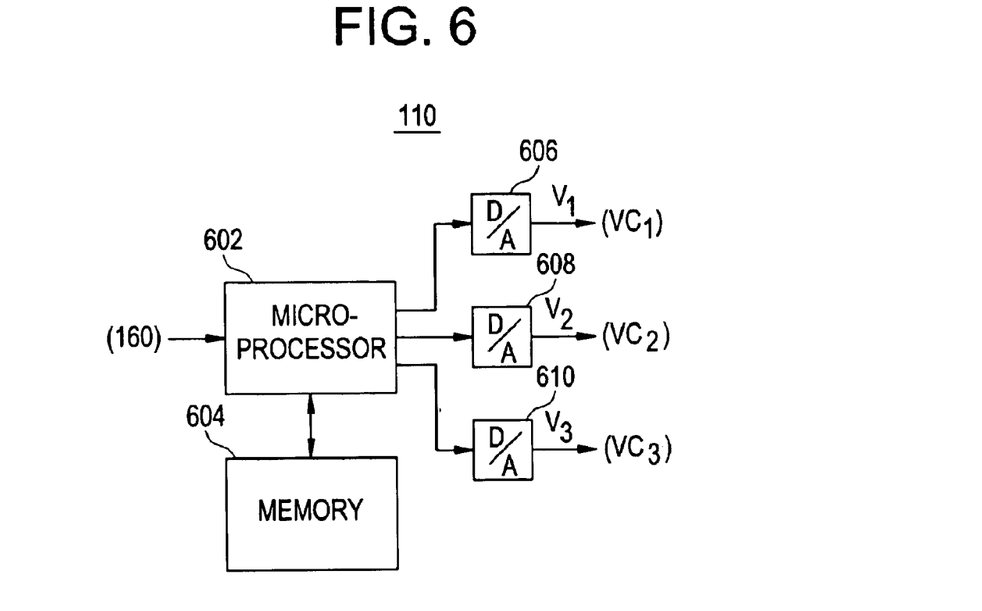
FIG. 6 is a block diagram of an electric current ratio adjusting section.

FIG. 6 shows a block diagram of the electric current ratio adjusting section 110. As shown, the electric current ratio adjusting section 110 comprises a microprocessor 602, a memory 604, and D-A converters 606, 608 and 610. The microprocessor 602 executes a program stored in the memory 604 under control by the sequence control section 160, and outputs voltages v1–v3 for adjusting the electrostatic capacitances of the variable capacitors VC1–VC3 via the D-A (digital-to-analog) converters 606, 608 and 610.

A portion comprised of the microprocessor 602, memory 604, D-A converters 606, 608 and 610, sequence control section 160 and data processing section 170 is an embodiment of the adjusting means of the present invention.

By individually changing the electrostatic capacitances of the variable capacitors VC1, VC2 and VC3 in the reception coil section 108, the ratios among electric currents i1, i2 and i3 flowing through the coil elements 810, 820 and 830 can be variously changed.

Since the ratios among electric currents i1, i2 and i3 flowing through the coil elements 810, 820 and 830 determine the sensitivity distribution of the reception coil section 108, the sensitivity distribution of the reception coil section 108 can be modified by individually changing the electrostatic capacitances of the variable capacitors VC1, VC2 and VC3 by the voltages v1, v2 and v3, and thus changing the ratios among electric currents i1, i2 and i3 in response to a change in their admittances. By using the electrostatic capacitances, the admittances can be easily changed. By using the admittances, the electric current ratios can be easily changed.

Figure 7:
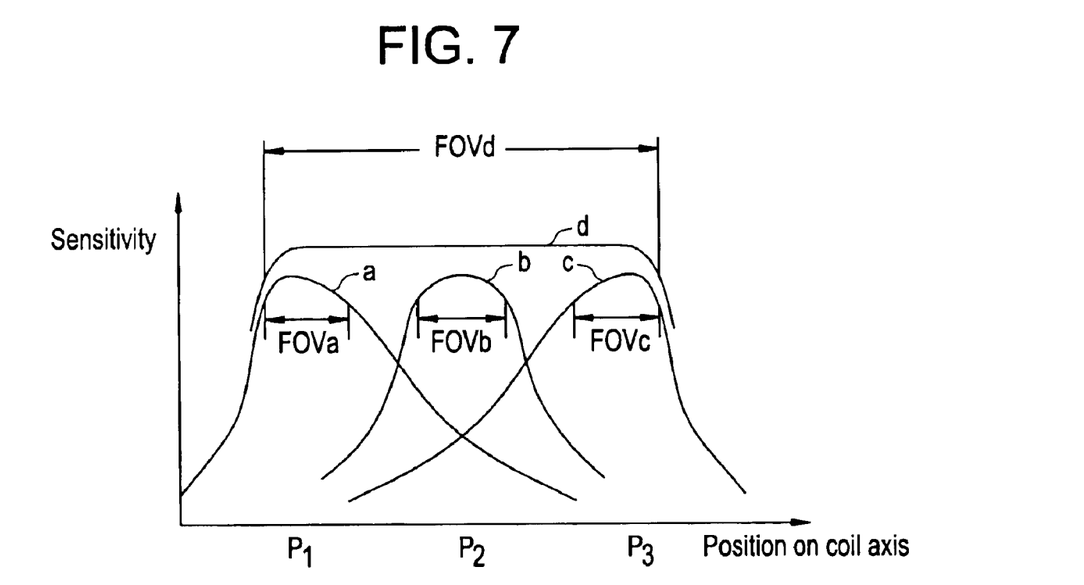
FIG. 7 shows an example of FOV adjustment.

FIG. 7 shows an exemplary modification of the sensitivity distribution. Curves a, b, c and d in FIG. 7 represent sensitivity distributions corresponding to certain electric current ratios. The curve a represents a case in which the electric current ratio of the coil element 810 is especially large, and the curve has the maximum sensitivity at a position P1 at which the coil elements 810 lies on the coil axis. The curve b represents a case in which the electric current ratio of the coil element 820 is especially large, and the curve has the maximum sensitivity at a position P2 at which the coil elements 820 lies on the coil axis. The curve c represents a case in which the electric current ratio of the coil element 830 is especially large, and the curve has the maximum sensitivity at a position P3 at which the coil elements 830 lies on the coil axis. The curve d represents a case in which the electric current ratios are approximately equal among the coil elements 810, 820 and 830, and the curve has a generally homogeneous sensitivity distribution from the position P1 through P3.

An FOV for magnetic resonance imaging is defined as a range down to the sensitivity reduced by a predetermined amount (for example, −3 dB), and FOV a-FOV d are thus defined. Since the electric current ratios can be appropriately adjusted in a continuous manner among the coil elements 810–830, any sensitivity distribution can be formed; hence, an arbitrary FOV can be obtained. Moreover, because the coil elements 810–830 are arranged at predetermined intervals on the coil axis, the FOV can be adjusted along the coil axis.

Figure 8:
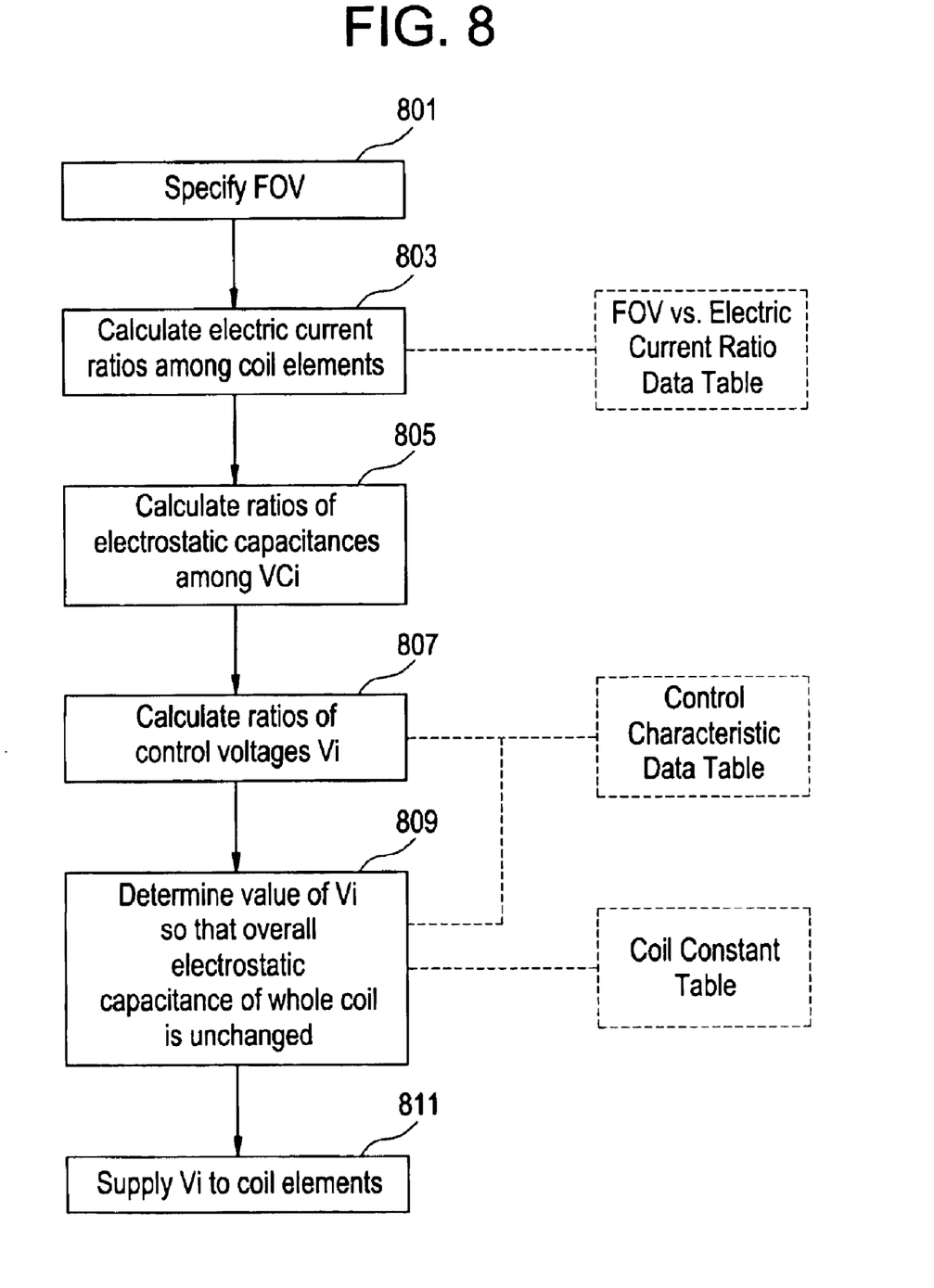
FIG. 8 is a flow chart of an operation of the present apparatus.

FIG. 8 shows a flow chart of an operation of the present apparatus when defining an FOV. As shown, at Stage 801, an FOV is specified. The specification of an FOV is conducted by the user via the display section 180 and operating section 190 according to the purpose of imaging.

Next, at Stage 803, the electric current ratios among the coil elements are calculated. The calculation of the electric current ratios is performed by the data processing section 170. The data processing section 170 calculates the electric current ratios using, for example, a data table in which a relationship predetermined by measurement between an FOV and certain electric current ratios is stored. Alternatively, the electric current ratios may be calculated via simulation based on known electromagnetic characteristics of the reception coil section 108.

Next, at Stage 805, the ratios of the electrostatic capacitances of the variable capacitors VCi are calculated. The calculation of the electrostatic capacitance ratios is performed by the data processing section 170. The data processing section 170 calculates the ratios of the electrostatic capacitances of the variable capacitors VCi such that the ratios of the admittances among the coil elements are equal to the electric current ratios.

Next, at Stage 807, the ratios of the control voltages vi are calculated. This calculation is also performed by the data processing section 170. The data processing section 170 calculates the ratios of the control voltages vi corresponding to the ratios of the electrostatic capacitances of the variable capacitors VCi using, for example, a data table representing control characteristics of the variable capacitors VCi.

The calculations at Stage 803 through Stage 807 can be achieved easily and at high speed by using, for example, a data table storing an experimentally predetermined relationship between FOV and certain vi ratios.

Next, at Stage 809, values of vi are determined so that the overall electrostatic capacitance of the whole coil is unchanged. This determination is performed by the data processing section 170. The data processing section 170 determines values of vi that keep the overall electrostatic capacitance of the parallel circuit of the coil elements 810–830 at a constant level while maintaining the ratios of vi using, for example, the control characteristic data table and a coil constant data table. Thus, the resonance frequency of the reception coil section 108 is unchanged regardless of adjustment on the variable capacitors VCi. If a change in frequency of a magnetic resonance signal to be received is to be followed, the overall electrostatic capacitance of the whole coil may be changed to modify the resonance frequency.

Next, at Stage 811, vi is supplied to each coil element. The supply of vi is conducted by the electric current ratio adjusting section 110. The electric current ratio adjusting section 110 supplies the control voltages vi to the reception coil section 108 under control by the sequence control section 160, which is in turn controlled by the data processing section 170. The FOV of the reception coil section 108 is thus defined as specified. Using such an FOV, magnetic resonance imaging is conducted as described above.

While the present invention has been described with reference to preferred embodiments hereinabove, various changes or substitutions may be made on these embodiments by those ordinarily skilled in the art pertinent to the present invention without departing from the technical scope of the present invention.

Therefore, the technical scope of the present invention encompasses not only those embodiments described above but all that fall within the scope of the appended claims.

What is claimed is:

1. An RF coil apparatus comprising:
a plurality of coil elements connected in parallel; and
an adjusting device for adjusting, based on a predetermined field of view, electric current ratios among said plurality of coil elements.

2. The RF coil apparatus of claim 1, wherein
said adjusting device adjusts the electric current ratios by adjusting admittances of said plurality of coil elements.

3. The RF coil apparatus of claim 2, wherein
said adjusting device adjusts the admittances by adjusting electrostatic capacitances of said plurality of coil elements.

4. An RF coil apparatus comprising:
a plurality of coil elements connected in parallel; and
an adjusting device for adjusting electric current ratios among said plurality of coil elements, said adjusting device adjusts the electric current ratios among said plurality of coil elements while keeping an overall electrostatic capacitance of the parallel circuit of said plurality of coil elements at a constant level.

5. An RF coil apparatus comprising:
a plurality of coil elements connected in parallel; and
an adjusting device for adjusting electric current ratios among said plurality of coil elements, said adjusting device stores the electric current ratios among said plurality of coil elements corresponding to an FOV.

6. An RF coil apparatus comprising:
a plurality of coil elements connected in parallel; and
an adjusting device for adjusting electric current ratios among said plurality of coil elements, said adjusting device also adjusts an overall electrostatic capacitance of the parallel circuit of said plurality of coil elements.

7. The RF coil apparatus of claim 6, wherein
said adjusting device stores the electric current ratios and circuit constants of said plurality of coil elements corresponding to an FOV.

8. An RF coil apparatus comprising:
a plurality of coil elements connected in parallel, said plurality of coil elements have a common coil axis, and are arranged at intervals on said coil axis; and
an adjusting device for adjusting electric current ratios among said plurality of coil elements.

9. A magnetic resonance imaging apparatus for collecting magnetic resonance signals while applying a static magnetic field, a gradient magnetic field and an RF magnetic field to a subject to be imaged, and producing an image based on the magnetic resonance signals, said apparatus comprising:
an RF coil apparatus for conducting at least one of the application of said RF magnetic field and reception of said magnetic resonance signals, said RF coil apparatus comprising:
a plurality of coil elements connected in parallel; and
an adjusting device for adjusting, based on a predetermined field of view, electric current ratios among said plurality of coil elements.

10. The magnetic resonance imaging apparatus of claim 9, wherein
said adjusting device adjusts the electric current ratios by adjusting admittances of said plurality of coil elements.

11. The magnetic resonance imaging apparatus of claim 10, wherein
said adjusting device adjusts the admittances by adjusting electrostatic capacitances of said plurality of coil elements.

12. A magnetic resonance imaging apparatus for collecting magnetic resonance signals while applying a static magnetic field, a gradient magnetic field and an RF magnetic field to a subject to be imaged, and producing an image based on the magnetic resonance signals, said apparatus comprising:
an RF coil apparatus for conducting at least one of the application of said RF magnetic field and reception of said magnetic resonance signals, said RF coil apparatus comprising:
a plurality of coil elements connected in parallel; and
an adjusting device for adjusting electric current ratios among said plurality of coil elements, said adjusting device adjusts the electric current ratios among said plurality of coil elements while keeping an overall electrostatic capacitance of the parallel circuit of said plurality of coil elements at a constant level.

13. A magnetic resonance imaging apparatus for collecting magnetic resonance signals while applying a static magnetic field, a gradient magnetic field and an RF magnetic field to a subject to be imaged, and producing an image based on the magnetic resonance signals, said apparatus comprising:
an RF coil apparatus for conducting at least one of the application of said RF magnetic field and reception of said magnetic resonance signals, said RF coil apparatus comprising:
a plurality of coil elements connected in parallel; and
an adjusting device for adjusting electric current ratios among said plurality of coil elements, said adjusting device stores the electric current ratios among said plurality of coil elements corresponding to an FOV.

14. A magnetic resonance imaging apparatus for collecting magnetic resonance signals while applying a static magnetic field, a gradient magnetic field and an RF magnetic field to a subject to be imaged, and producing an image based on the magnetic resonance signals, said apparatus comprising:
an RF coil apparatus for conducting at least one of the application of said RF magnetic field and reception of said magnetic resonance signals, said RF coil apparatus comprising:
a plurality of coil elements connected in parallel; and
an adjusting device for adjusting electric current ratios among said plurality of coil elements, said adjusting device also adjusts an overall electrostatic capacitance of the parallel circuit of said plurality of coil elements.

15. The magnetic resonance imaging apparatus of claim 14, wherein
said adjusting device stores the electric current ratios and circuit constants of said plurality of coil elements corresponding to an FOV.

16. A magnetic resonance imaging apparatus for collecting magnetic resonance signals while applying a static magnetic field, a gradient magnetic field and an RF magnetic field to a subject to be imaged, and producing an image based on the magnetic resonance signals, said apparatus comprising:
an RF coil apparatus for conducting at least one of the application of said RF magnetic field and reception of said magnetic resonance signals, said RF coil apparatus comprising:
a plurality of coil elements connected in parallel; and
an adjusting device for adjusting electric current ratios among said plurality of coil elements, said plurality of coil elements have a common coil axis, and are arranged at intervals on said coil axis.

* * * * *